US011309388B2

(12) United States Patent
Cook et al.

(10) Patent No.: US 11,309,388 B2
(45) Date of Patent: *Apr. 19, 2022

(54) MULTI-SUPER LATTICE FOR SWITCHABLE ARRAYS

(71) Applicant: Texas Instruments Incorporated, Dallas, TX (US)

(72) Inventors: Benjamin Stassen Cook, Addison, TX (US); Luigi Colombo, Dallas, TX (US); Nazila Dadvand, Richardson, TX (US); Archana Venugopal, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/995,563

(22) Filed: Aug. 17, 2020

(65) Prior Publication Data

US 2020/0381517 A1    Dec. 3, 2020

Related U.S. Application Data

(63) Continuation of application No. 16/229,827, filed on Dec. 21, 2018, now Pat. No. 10,748,999.

(51) Int. Cl.
| H01L 29/15 | (2006.01) |
| H01L 29/16 | (2006.01) |
| H01L 29/423 | (2006.01) |
| H01L 29/808 | (2006.01) |
| H01L 29/66 | (2006.01) |

(52) U.S. Cl.
CPC ........ *H01L 29/151* (2013.01); *H01L 29/1606* (2013.01); *H01L 29/42316* (2013.01); *H01L 29/808* (2013.01); *H01L 29/66045* (2013.01)

(58) Field of Classification Search
CPC .......... H01L 29/1606; H01L 29/66045; H01L 29/151; H01L 29/808; H01L 29/42316
See application file for complete search history.

(56) References Cited

U.S. PATENT DOCUMENTS

| 7,653,279 | B1 | 1/2010 | Jacobsen |
| 8,906,593 | B1 | 12/2014 | Nowak et al. |
| 9,415,562 | B1 | 8/2016 | Schaedler et al. |
| 10,748,999 | B2 * | 8/2020 | Cook ................ H01L 29/66439 |
| 2006/0186502 | A1 | 8/2006 | Shimotani et al. |

(Continued)

FOREIGN PATENT DOCUMENTS

| RU | 2577273 C1 | 3/2016 |
| WO | 2016080910 A1 | 5/2016 |

OTHER PUBLICATIONS

International Search Report for PCT/US2018/067997 dated Apr. 4, 2019.

(Continued)

*Primary Examiner* — Changhyun Yi
(74) *Attorney, Agent, or Firm* — Michael A. Davis, Jr.; Charles A. Brill; Frank D. Cimino (57) ABSTRACT

A switchable array includes: a microstructure of interconnected units formed of graphene tubes with open spaces in the microstructure bounded by the graphene tubes; at least one JFET gate in at least one of the graphene tubes; and a control line having an end connected to the at least one JFET gate. The control line extends to a periphery of the microstructure.

9 Claims, 14 Drawing Sheets

(56) References Cited

U.S. PATENT DOCUMENTS

| | | |
|---|---|---|
| 2010/0143701 A1 | 6/2010 | Zhu et al. |
| 2012/0261673 A1 | 10/2012 | Schulze et al. |
| 2013/0189444 A1 | 7/2013 | Kub et al. |
| 2013/0230722 A1 | 9/2013 | Fujii et al. |
| 2014/0140647 A1 | 5/2014 | Saxton |
| 2014/0315093 A1 | 10/2014 | Greer et al. |
| 2015/0176132 A1 | 6/2015 | Hundley et al. |
| 2016/0304346 A1 | 10/2016 | Zhang et al. |
| 2017/0044016 A1 | 2/2017 | Smith et al. |
| 2017/0082569 A1 | 3/2017 | Sommer et al. |
| 2017/0200909 A1 | 7/2017 | Sonkusale et al. |
| 2017/0278930 A1 | 9/2017 | Ruhl et al. |
| 2018/0088462 A1 | 3/2018 | Vyatskikh et al. |
| 2019/0013386 A1 | 1/2019 | Shinohara et al. |

OTHER PUBLICATIONS

International Search Report for PCT/US2018/068171 dated Apr. 18, 2019.

Xiaoyu Zheng et al., Ultralight, Ultrastiff Mechanical Metamaterials; Science 344 (2014) 1373-1377.

T. A. Schaedler, et al., Ultralight Metallic Microlattices; Science 334 (2011) 962-965.

Y. T. Liang, et al., Towards Rationally Designed Graphene-Based Materials and Devices, Macromol. Chem. Phys. 213 (2012) 1091-1100.

Li, et al. "High-Density Three-Dimension Graphene Macroscopic Objects for High-Capacity Removal of Heavy Metal Ions," Scientific Reports I 3: 2125 I DOI: 10.1038/srep02125, 2013, 6 pages.

* cited by examiner

MULTI-SUPER LATTICE FOR SWITCHABLE ARRAYS

CROSS-REFERENCE TO RELATED APPLICATIONS

This application is a continuation of U.S. patent application Ser. No. 16/229,827 filed Dec. 21, 2018, and is related to U.S. patent application Ser. No. 16/229,668 filed Dec. 21, 2018, and to U.S. patent application Ser. No. 16/229,822 filed Dec. 21, 2018, and to U.S. patent application Ser. No. 16/230,070 filed Dec. 21, 2018, and to U.S. patent application Ser. No. 16/229,971 filed Dec. 21, 2018, and to U.S. patent application Ser. No. 16/230,045 filed Dec. 21, 2018, all of which are hereby fully incorporated herein by reference for all purposes.

BACKGROUND

Graphene is a single-layer $sp^2$-hybridized 2D network of carbon atoms that serves as the basis of many allotropes of carbon. It can be stacked to form 3D graphite, rolled to form 1D carbon nanotubes, and fused to form 0D fullerenes. Owing to its strongly delocalized electron configuration, graphene exhibits exceptional charge carrier mobility, thermal conductivity, mechanical strength, and chemical stability. However, like other nanomaterials, the properties of graphene are dependent on its dimensions, physical environment, and integration schemes. Graphene and graphene-based materials have tailorable properties that can be exploited in a broad range of devices, including transistors, capacitors, electron field emitters, transparent conductors, sensors, catalysts, and drug delivery agents. Other 2D crystals, most notably boron nitride and molybdenum disulfide, have also been isolated.

Two-dimensional (2D) $sp^2$-bonded carbon exists in the form of graphene, buckyballs and carbon nanotubes (CNTs). Graphene is "flat" or 2D, fullerenes ("Buckyballs") are spherical or 0D, and CNTs are tubes in 1D. Forming these materials in a singular, regular, repeatable structure has not previously been achieved. Superstructures of these materials may provide very strong, light, highly thermally and electrically conductive structures. Attempts have been made to fabricate $sp^2$-bonded sponges, however these structures are irregular with properties that vary with position.

The isolation of graphene via the mechanical exfoliation of graphite has sparked strong interest in two-dimensional (2D) layered materials. The properties of graphene include exceptional strength, and high electrical and thermal conductivity, while being lightweight, flexible and transparent. This opens the possibility of a wide range of potential applications, including high-speed transistors and sensors, barrier materials, solar cells, batteries, and composites.

Other classes of 2D materials of interest include transition metal dichalcogenide (TMDC) materials, hexagonal boron nitride (h-BN), as well as those based on Group 14 elements, such as silicene and germanene. The properties of these materials can range from semi-metallic, for example, $NiTe_2$ and $VSe_2$, to semiconducting, for example, $WSe_2$ and $MoS_2$, to insulating, for example, hexagonal boron nitride (h-BN).

Growth of regular 3D superstructures using $sp^2$-bonded carbon may address the shortcomings of the flexible $sp^2$ carbons for 3D applications given that hexagonally arranged carbon is strong, chemically inert, electrically and thermally conductive, and optically transparent. Such 3D superstructures may find used in a number of applications from packaging, thin optically transparent electrically conductive strong thin films, and many more.

When a carbon atom is attached to three groups (or, as in the case of graphene, three other carbon atoms) via three σ bonds, it requires three orbitals in the hybrid set. This requires $sp^2$ hybridization.

An $sp^2$-hybridized bond has 33% s and 67% p character. The three $sp^2$ hybrid orbitals point towards the corners of a triangle at 120° to each other. Each $sp^2$ hybrid is involved in a σ bond. The remaining p orbital forms the π bond. A carbon double bond may be viewed as a σ+π bond.

A three-dimensional integrated circuit (3D IC) is an integrated circuit manufactured by stacking silicon wafers or dies and interconnecting them vertically using, for instance, through-silicon vias (TSVs) or Cu—Cu connections, so that they behave as a single device to achieve performance improvements at reduced power and smaller footprint than conventional two-dimensional processes. A multi-layer or super lattice structure such as is disclosed herein may be used to create a switchable array in a 3D IC.

The junction gate field-effect transistor (JFET) is the simplest type of field-effect transistor. They are three-terminal semiconductor devices that can be used as electronically-controlled switches, amplifiers, or voltage-controlled resistors.

Unlike bipolar transistors, JFETs are exclusively voltage-controlled in that they do not need a biasing current. Electric charge flows through a semiconducting channel between source and drain terminals and by applying a reverse bias voltage to a gate terminal, the channel is "pinched", so that the electric current is impeded or switched off completely. A JFET is usually on when no potential difference exists between its gate and source terminals. If a potential difference of the proper polarity is applied between its gate and source terminals, the JFET will be more resistive to current flow, which means less current would flow in the channel between the source and drain terminals. Thus, JFETs are sometimes referred to as depletion-mode devices.

JFETs can have an n-type or p-type channel. For n-type devices, if the voltage applied to the gate is less than that applied to the source, the current will be reduced (similarly for p-type devices, if the voltage applied to the gate is greater than that applied to the source). A JFET has a large input impedance (sometimes on the order of $10^{10}$ ohms), which means that it has a negligible effect on external components or circuits connected to its gate.

The JFET is a long channel of semiconductor material, doped to contain an abundance of positive charge carriers or holes (p-type), or of negative carriers or electrons (n-type). Ohmic contacts are formed at the source (S) and the drain (D). A p-n-junction is formed on one or both sides of the channel, or surrounding it, using a region with doping opposite to that of the channel, and biased using an ohmic gate contact (G).

SUMMARY

A switchable array includes: a microstructure of interconnected units formed of graphene tubes with open spaces in the microstructure bounded by the graphene tubes; at least one JFET gate in at least one of the graphene tubes; and a control line having an end connected to the at least one JFET gate. The control line extends to a periphery of the microstructure.

DETAILED DESCRIPTION OF EXAMPLE EMBODIMENTS

An organic/inorganic superstructure may be used as a template for the formation of a 3D metal superstructure that may then be used to grow graphitic carbon on the surface of the metal. The template may be fabricated through a self-propagating photopolymer waveguide technique (see, e.g., Xiaoyu Zheng et. al., Ultralight, Ultrastiff Mechanical Metamaterials; *Science* 344 (2014) 1373-1377 and T. A. Schaedler, et al., Ultralight Metallic Micro-lattices; *Science* 334 (2011) 962-965). As illustrated schematically in FIG. 1A, an interconnected 3D photopolymer lattice may be produced upon exposure of an appropriate liquid photomonomer 16 to collimated UV light 12 through a specifically designed (e.g. using a computer-aided design model 10) digital mask 14 that contains openings with certain spacing and size. The fabricated organic polymer template micro-lattice 18 may then be coated by electroless copper or other suitable metal (e.g. Ni, Co, Au, Ag, and alloys thereof) followed by etching away the organic polymeric matrix (scaffold). The resulting metal-based micro-lattice may be treated with oxygen to minimize agglomeration and then used as a template to grow graphene. The light surface oxidation may also act as a source of oxygen to increase the dehydrogenation of the hydrocarbon precursors. The thickness of the electroless plated metal may be controlled in the nanometer to micrometer range by adjusting the plating time, temperature, and/or plating chemistry.

Figure 1A:
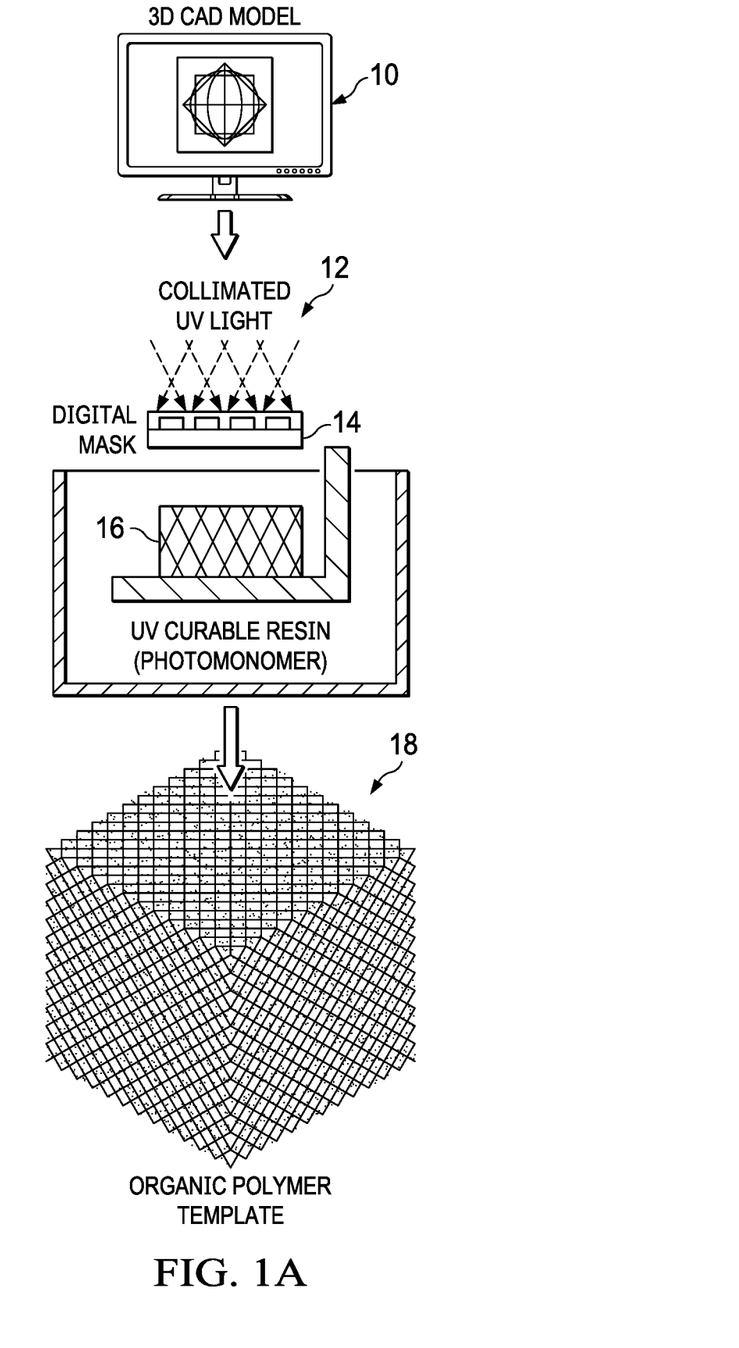
FIG. 1A is a schematic drawing of a fabrication process for a metal-based micro-lattice template in accordance with an example.

FIG. 1A schematically illustrates an example fabrication process of organic polymeric micro-lattices (scaffolds) 18 before coating with electroless plating.

This description describes a "periodically structured" carbon nanostructure. Conventional carbon nanostructures are irregular and have much larger dimensions than those which may be achieved using the methodology disclosed herein.

The process herein is useful to create a regular array with superstructure dimensions (unit) and structure that may be optimized for strength, thermal and other fundamental properties.

Several aspects of this procedure are noteworthy:
  it provides a regular structure with specific defined dimensions;
  it can form very thin metal (e.g. Ni, Co, Ru, Cu, Ag, Au, and alloys thereof) micro-lattices;
  it enables the formation of graphitic carbon on very thin metals and thin metal wires or tubes.

The process herein uses a polymeric structure as a template for such fabrication with the subsequent formation of a metal superstructure that may then be exposed to a hydrocarbon (e.g. methane, ethylene, acetylene, benzene) to form graphene, followed by etching of the metal from under the resulting graphene microstructure using appropriate etchants such as, for example, $FeCl_3$ or potassium permanganate.

Collimated UV light 12 through a photomask 14 or multi-photon lithography may be used in a photo-initiated polymerization process to produce a polymer micro-lattice 18 including interconnected units. Example polymers include polystyrene and poly(methyl methacrylate) (PMMA). Once polymerized in the desired pattern, the remaining un-polymerized monomer may be removed.

The polymer structure (polymer scaffold) may then be plated with a suitable metal using an electroless plating process.

Electroless nickel plating (EN) is an auto-catalytic chemical technique that may be used to deposit a layer of nickel-phosphorus or nickel-boron alloy on a solid workpiece, such as metal, plastic, or ceramic. The process relies on the presence of a reducing agent, for example hydrated sodium hypophosphite ($NaPO_2H_2.H_2O$) which reacts with the metal ions to deposit the metal. Alloys with different percentages of phosphorus, ranging from 2-5 weight percent (low phosphorus) to up to 11-14 weight percent (high phosphorus) are possible. The metallurgical properties of the alloys depend on the percentage of phosphorus.

Electroless plating has several advantages over electroplating. Free from flux-density and power supply issues, it provides an even deposit regardless of workpiece geometry, and with the proper pre-plate catalyst, may be used to deposit metals on non-conductive surfaces. In contrast, electroplating can only be performed on electrically conductive substrates.

Before performing electroless plating, the material to be plated must be cleaned by a series of chemicals; this is known as a pre-treatment process. Failure to remove surface contaminants may result in poor plating. Each chemical pre-treatment must be followed by water rinsing (normally two to three times) to remove residual chemicals that may adhere to the surface. For example, de-greasing chemicals can be used to remove oils from surfaces, whereas acid cleaning is used to remove metal oxides.

Activation may be done with an immersion into a sensitizer/activator solution—for example, a mixture of palladium chloride, tin chloride, and hydrochloric acid.

The pre-treatment required for the deposition of metals on a non-conductive surface usually consists of an initial surface treatment to render the substrate hydrophilic. Following this initial step, the surface may be activated by a solution of a noble metal, e.g., palladium chloride. The substrate is then ready for electroless deposition.

The electroless plating reaction is accomplished when hydrogen is released by a reducing agent, normally sodium hypophosphite (with the hydrogen leaving as a hydride ion) or thiourea, and oxidized, thus producing a negative charge on the surface of the part. The most common electroless plating method is electroless nickel plating, although silver, gold and copper layers can also be applied in this manner.

In principle, any hydrogen-based reducing agent can be used although the redox potential of the reducing half-cell must be high enough to overcome the energy barriers inherent in liquid chemistry. Electroless nickel plating most often employs hypophosphite as the reducer while plating of other metals like silver, gold and copper typically makes use of low-molecular-weight aldehydes.

A benefit of this approach is that the technique can be used to plate diverse shapes and types of surfaces.

Figure 1B:
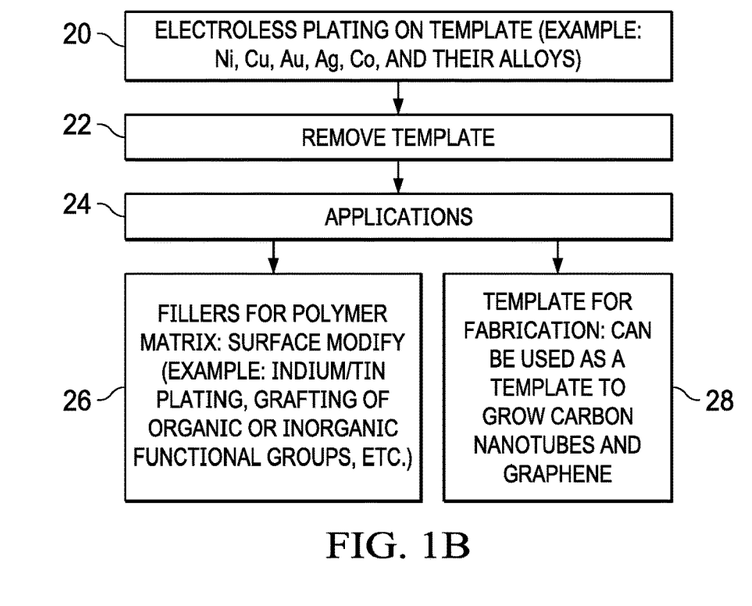
FIG. 1B is a flowchart of the fabrication process depicted schematically in FIG. 1A.
Figure 2:
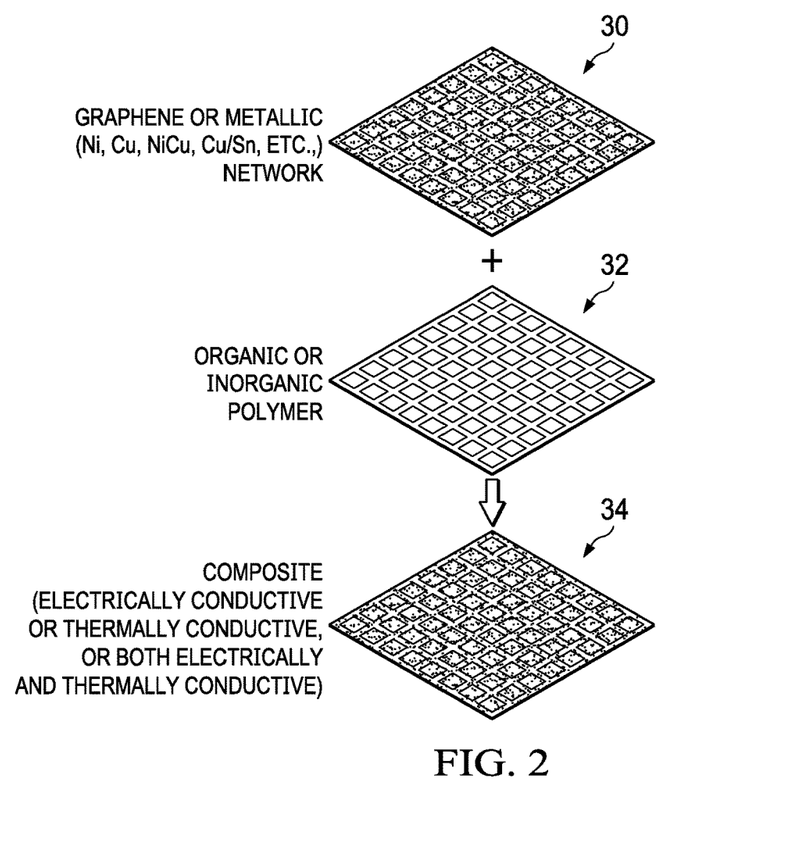
FIG. 2 is a schematic diagram of the fabrication of an electrically, thermally, or both thermally and electrically conductive composite by embedding a fabricated metal-based or graphene-based micro-lattice within an organic polymer matrix.

As illustrated in FIG. 1B, the organic polymeric micro-lattice may be electrolessly plated 20 with metal followed by dissolving out 22 the organic polymer scaffold. The resulting metal-based micro-lattice may be used in several applications 24; for example, it may then be coated with a thin layer of immersion tin to prevent the metal from oxidizing during subsequent processing steps which may include a heat treatment. Alternatively, the surface of the metal-based micro-lattice may be functionalized with appropriate functional groups 26 to provide anchoring or reactions sites for subsequent interaction with a polymer matrix. The fabricated and surface-treated metallic network 30 may be embedded within an organic polymeric matrix 32 to fabricate electrically and/or thermally conductive composites 34 (see FIG. 2). Alternatively, the fabricated metallic network 30 may be used as a template 28 to synthesize a graphitic carbon superstructure. The metal may then be etched out to produce a graphene microstructure including interconnected units formed of graphene tubes that are connected to other graphene tubes while still maintaining the sp²-bonded nature.

Figure 3:
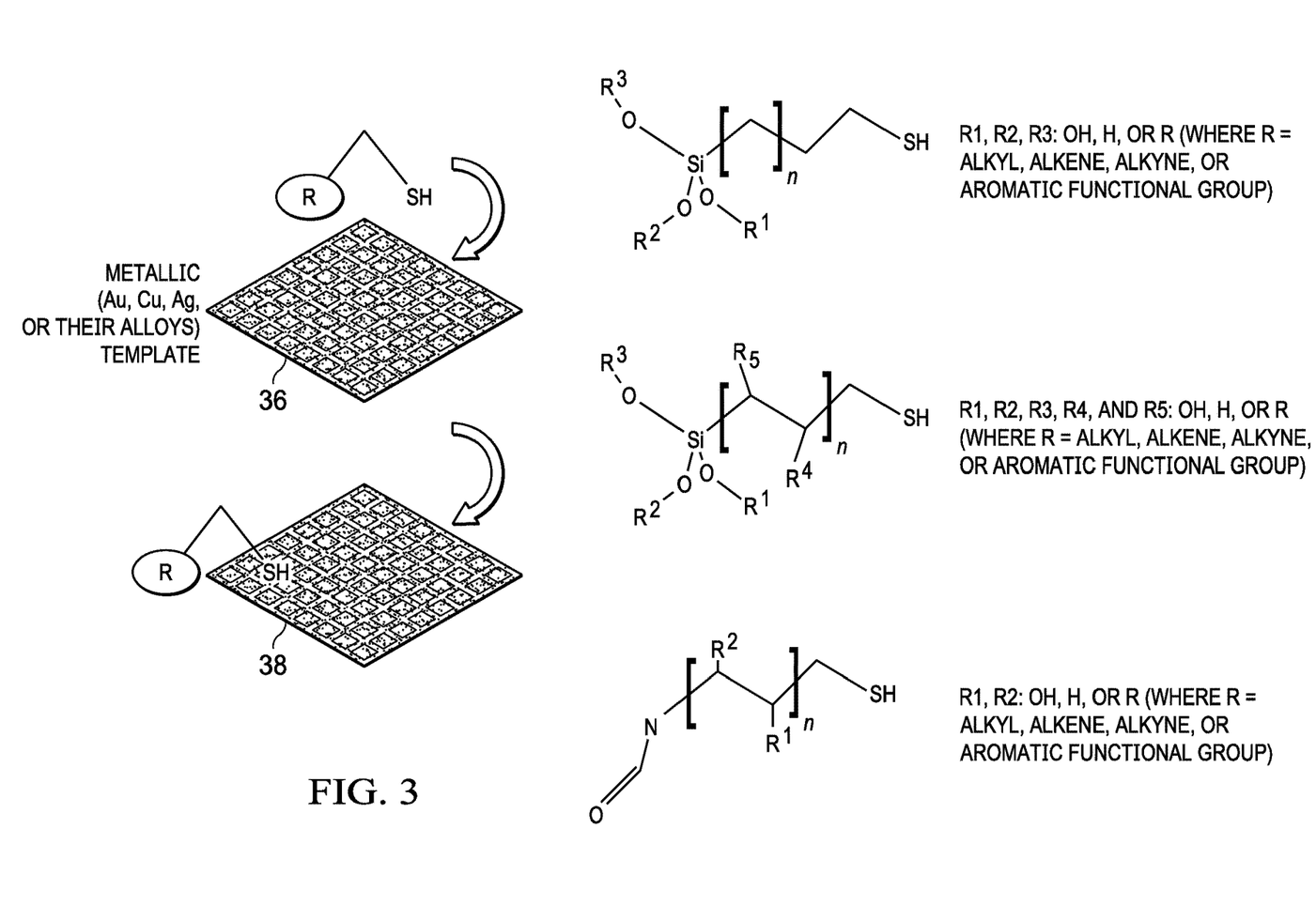
FIG. 3 is a schematic diagram of a surface functionalization methodology for functionalizing a fabricated metal-based micro-lattice.

FIG. 3 schematically illustrates a surface treatment methodology for functionalizing the fabricated metal-based micro-lattice. As shown in the drawing, the surface of the metal micro-lattice 36 may be exposed to a mercaptan-based compound. The mercaptan-based compound may be a hydroxylated alkyl mercaptan such as 3-mercapto-1,2 dihydroxy propane or it may be based on an isocyanate function group such as isocyanate alkyl trialkoxy silane. The mercaptan-based compound bonds to the metal (such as e.g. copper, silver or gold) through the sulfur atom of the mercapto moiety resulting in a hydroxylated metal surface 38. The hydroxyl functional groups grafted on the metal surface may then react with a reactive functional group from the pre-polymer matrix. In the case of isocyanate-based mercaptan compounds, the free isocyanate functional groups may subsequently be reacted with certain functional groups of the organic polymeric matrix such as —OH, —NH, etc. resulting in the formation of chemical bonds at the copper-organic polymer interface. The polymer for the composite may be selected for its mechanical properties and/or electronic properties. Example polymers include fluorocarbons (such as polytetrafluoroethylene) and polybutadiene.

In an example, the growth of graphene on the metal tubes may be omitted in order to produce a microlattice of interconnected metal tubes. A process for forming such a metal microstructure may include: photo-initiating the polymerization of a monomer in a pattern of interconnected units to form a polymer micro-lattice; removing unpolymerized monomer; coating the polymer micro-lattice with a metal; and removing the polymer micro-lattice to leave a micro-lattice of interconnected metal tubes in a pattern of interconnected units.

In another example, a metal/graphene microstructure of graphene-coated metal tubes in a pattern of interconnected units which may be prepared by the process including steps of: photo-initiating the polymerization of a monomer in a pattern of interconnected units to form a polymer micro-lattice; removing unpolymerized monomer; coating the polymer micro-lattice with a metal; removing the polymer micro-lattice to leave a metal micro-lattice; and forming graphene on the metal micro-lattice.

As illustrated in FIGS. 4-15, the micro-lattice may form a switched array of connections. Among graphene's uncommon properties is its high electrical conductivity. This property makes the material attractive for many applications, but the lack of a bandgap makes it difficult to use for high-performance transistors due to its low $I_{on}/T_{off}$.

Various methods are known to introduce a bandgap into graphene—e.g. by fabricating graphene in specific shapes (like ribbons), or by forming bi-layers of graphene. Further, other 2D materials such as transition metal dichalcogenides, boron-carbon-nitride, or graphene-oxide, -hydride or—fluoride, can form films with a bandgap, and thus can be used instead of or together with graphene.

Referring to FIGS. 4-9, a method for fabricating micro-lattices of graphene/carbon nanotubes suitable for use in switchable arrays includes: a) patterning a graphene/carbon nanotube micro-lattice; b) patterning gates at selected locations in the micro-lattice; and, c) patterning a control-line "superlattice" for controlling the gates.

Figure 4:
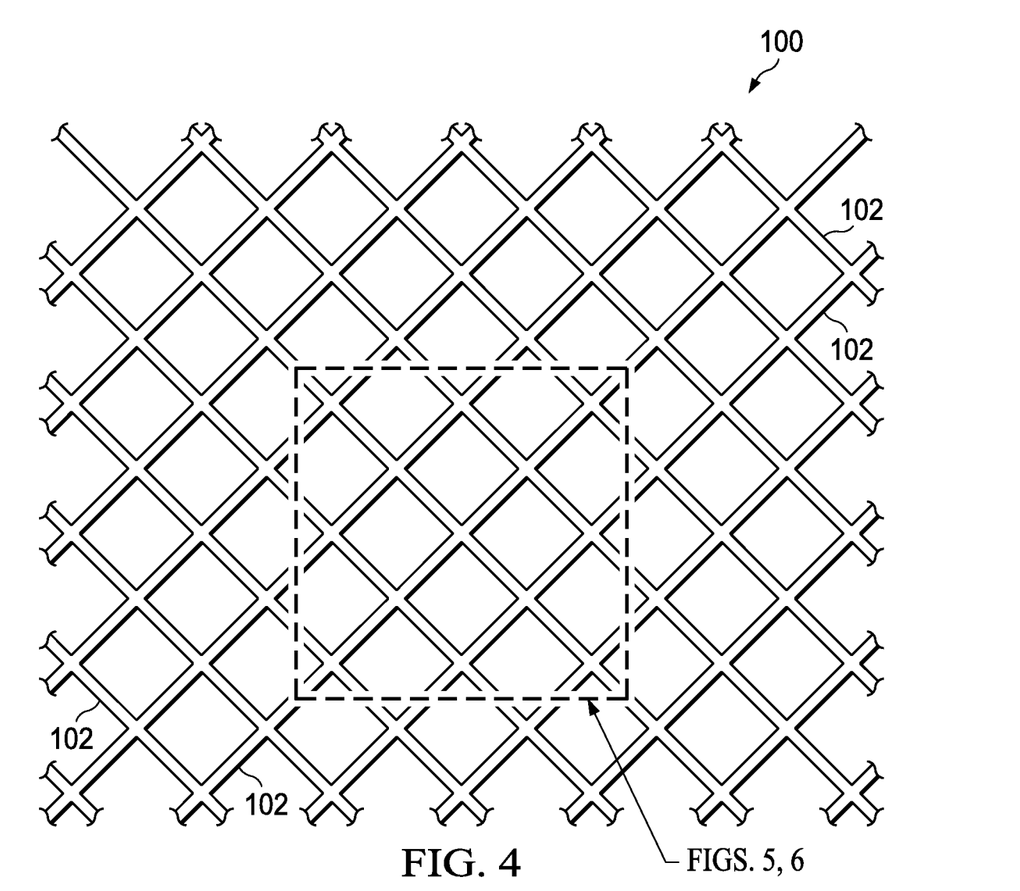
FIG. 4 is a 2D schematic representation of a graphene or graphene/polymer micro-lattice.

The following reference numbers are used in the drawings:
  10 CAD design model
  12 collimated UV light
  14 digital mask
  16 photomonomer
  18 organic polymer template
  20 electroless plating on template
  22 removal of template
  24 applications
  26 fillers for polymer matrix application
  28 template to grow carbon nanotubes and graphene application
  30 graphene or metallic network
  32 organic or inorganic polymer
  34 composite
  36 metallic template
  38 hydroxylated metal surface
  100 graphene/cnt superlattice 102 interconnected lattice members
104 polymer surrounding connections
106 dielectric and metal coating (on 102)
108 central void
110 graphene
112 insulator
114 metal
116 gate
118 external gate contact
120 polymer surrounding gate
122 metal
124 external surface of superlattice
126 connection
128 opening in lattice
130 gate
132 gate connector FIG. 4 schematically illustrates a graphene or graphene/polymer micro-lattice 100 including interconnected units of orthogonal, interconnected members 102 as viewed from the top or side of the micro-lattice made up of graphene/polymer or graphene interconnected tubes. This stage of the process is through the graphene/polymer etch step. The portion indicated at "A" is further illustrated in FIGS. 5-9. Such a graphene or graphene/polymer micro-lattice may be fabricated by the method described above which involves a photo-initiated polymerization using multi-photon lithography or collimated light through a photomask.

Figure 5:
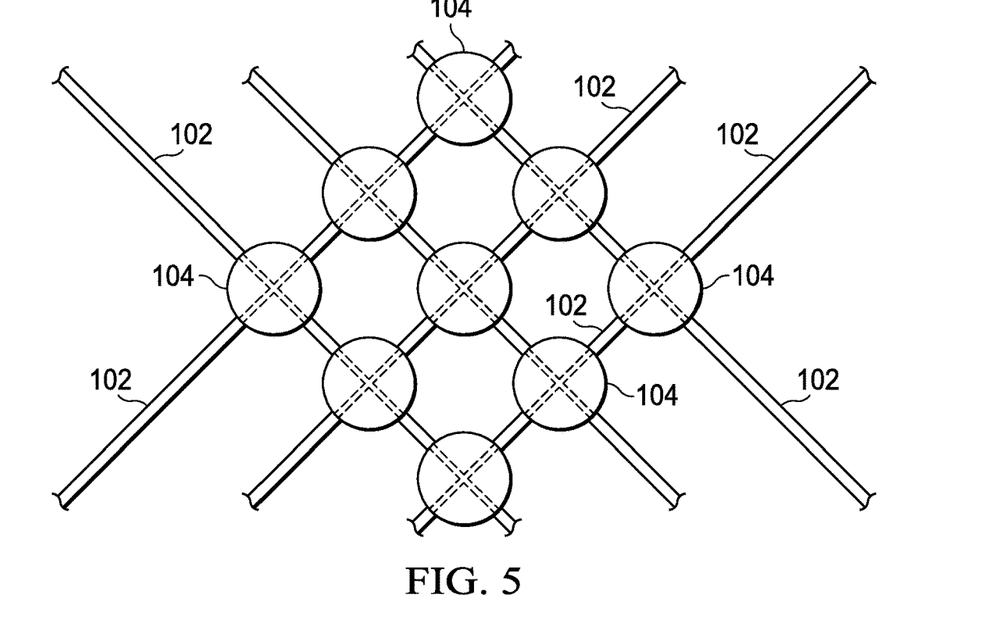
FIG. 5 is a 2D schematic representation of the graphene or graphene/polymer micro-lattice depicted in FIG. 4 with polymer applied around the connections between the micro-lattice members.

In FIG. 5, polymer 104 has been applied around the connections between the members 102 of the graphene or graphene/polymer micro-lattice 100 depicted in FIG. 4. This may be accomplished by immersing the micro-lattice in additional monomer and sending in a wider beam of light to photo-initiate polymerization around the connections.

Figure 6:
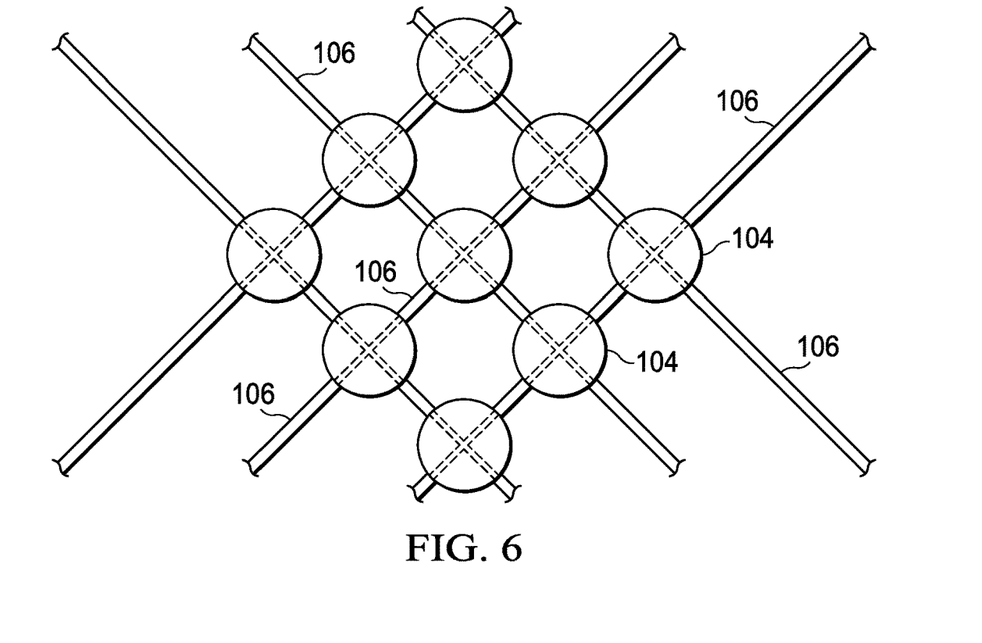
FIG. 6 is a 2D schematic representation of the graphene or graphene/polymer micro-lattice depicted in FIG. 5 with the micro-lattice members coated with dielectric and metal in the portions not having polymer applied around the connections.

In FIG. 6, portions of the micro-lattice members 102 not covered by the polymer applied around the connections between them have been coated with dielectric and metal 106.

Figure 7A:
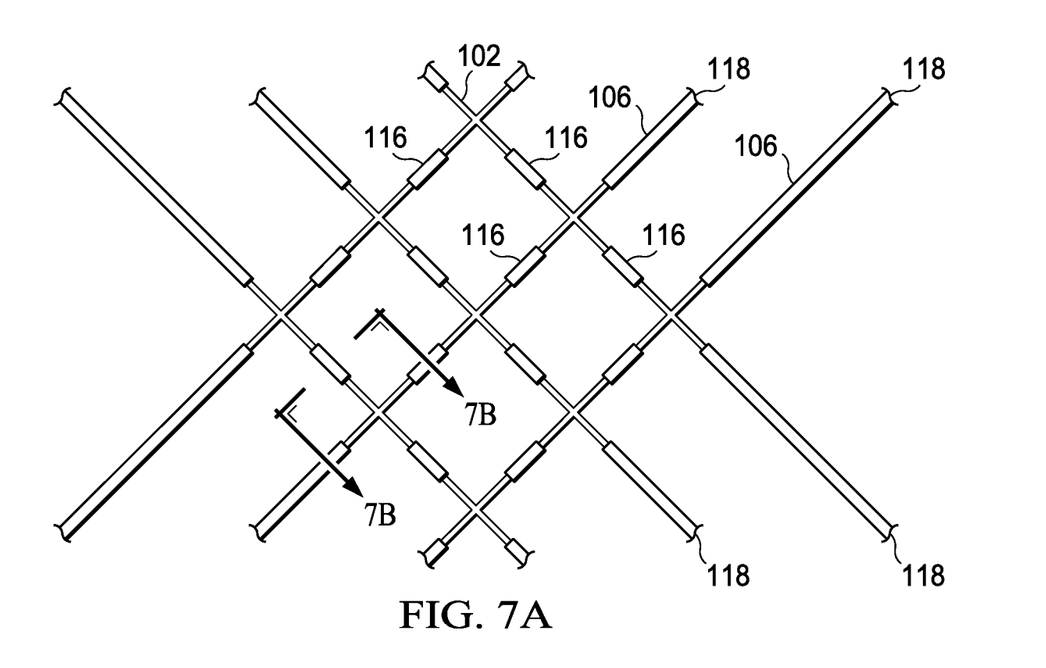
FIG. 7A is a 2D schematic representation of the graphene or graphene/polymer micro-lattice depicted in FIG. 6 with the plating resist removed, leaving gates.
Figure 7B:
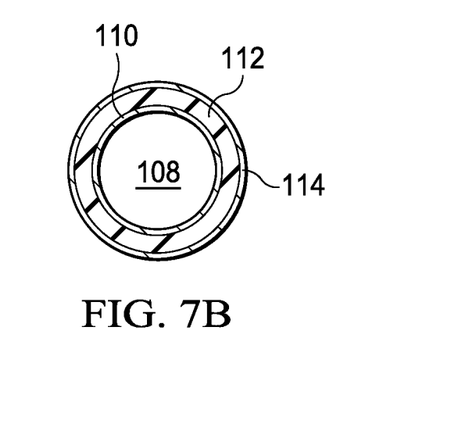
FIG. 7B is a cross-sectional view of the graphene or graphene/polymer micro-lattice shown in FIG. 7A taken along line 7B-7B.

In FIG. 7, the plating resist has been removed, leaving gates 116. A cross-sectional view of the gate is shown on the left of FIG. 7, in which 108 is the central void space left when the polymer is removed, 110 is the resulting graphene tube, 112 is a dielectric insulator layer, and 114 is the metal coating. Electrical contacts 118 may extend to an edge of the die.

Figure 8A:
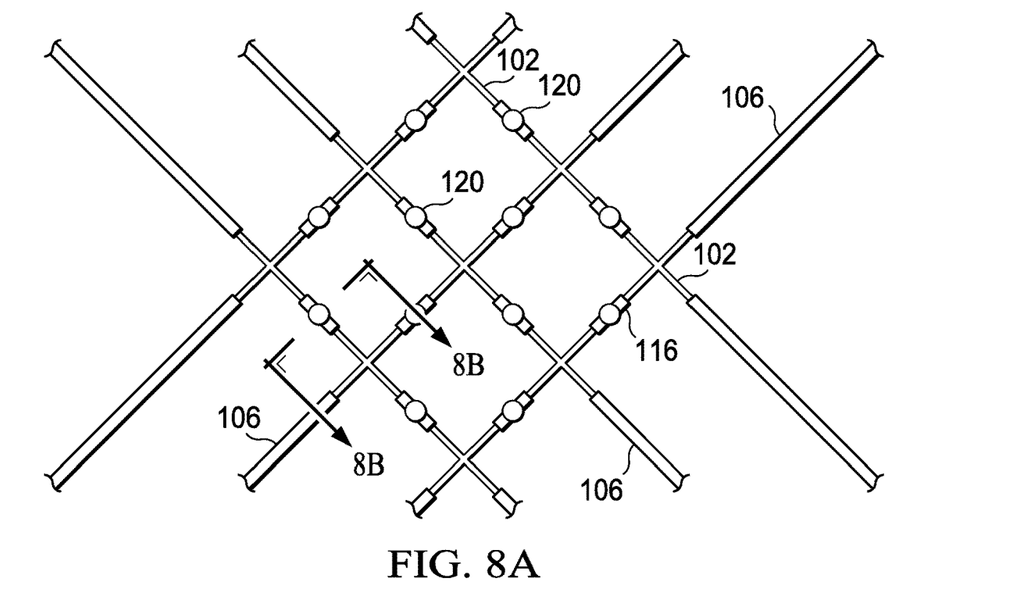
FIG. 8A is a 2D schematic representation of the graphene or graphene/polymer micro-lattice depicted in FIG. 7A with additional polymer applied around the gates.
Figure 8B:
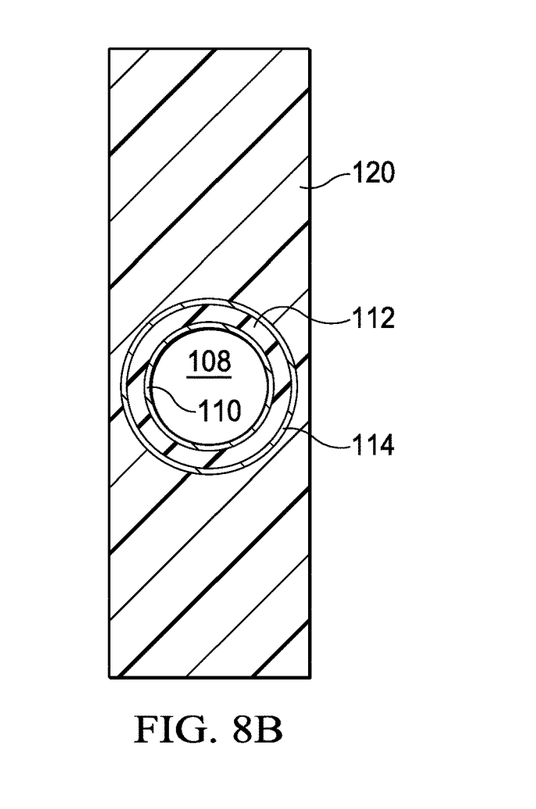
FIG. 8B is a cross-sectional view of the graphene or graphene/polymer micro-lattice shown in FIG. 8A taken along line 8B-8B.

FIG. 8 depicts the result of a third polymerization step in which the micro-lattice is again immersed in monomer and beams of light slightly wider than the diameter of the gate are sent in to photo-initiate polymerization around the gates. A cross-sectional view of the gate surrounded by polymer is shown on the left of FIG. 8.

Figure 9A:
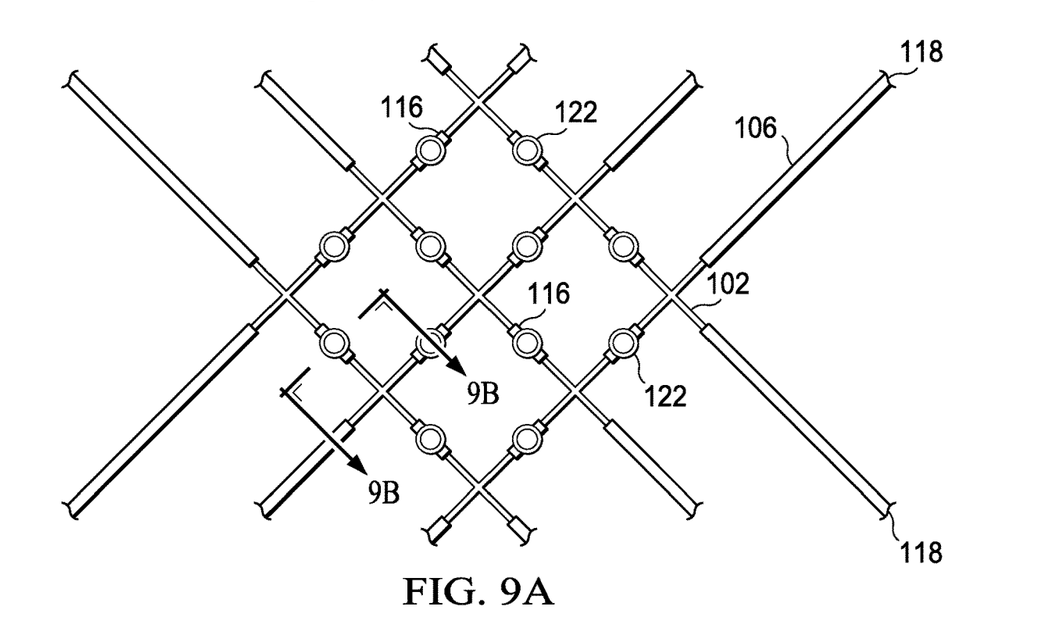
FIG. 9A is a 2D schematic representation of the graphene or graphene/polymer micro-lattice depicted in FIG. 8 with the additional polymer applied around the gates plated with metal.
Figure 9B:
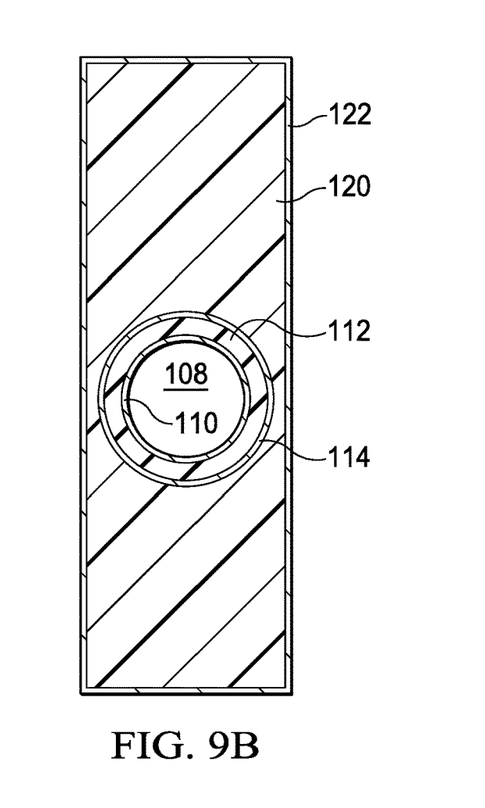
FIG. 9B is a cross-sectional view of the graphene or graphene/polymer micro-lattice shown in FIG. 9A taken along line 9B-9B.

In FIG. 9, the additional polymer applied around the gates is shown plated with metal 122. This is done so as to provide electrical connections to the gates. Alternatively, other electrical conductors (such as graphene, for example) could be used as the coating material.

FIGS. 10-15 show how certain gates in a six-unit-cell portion of micro-lattice switchable array 100 may be controlled. Gate connectors 132 may be routed through openings 128 in micro-lattice 100 to reach selected gates 130 from external surface 124 of the superlattice via external gate contacts 118'.

Figure 10:
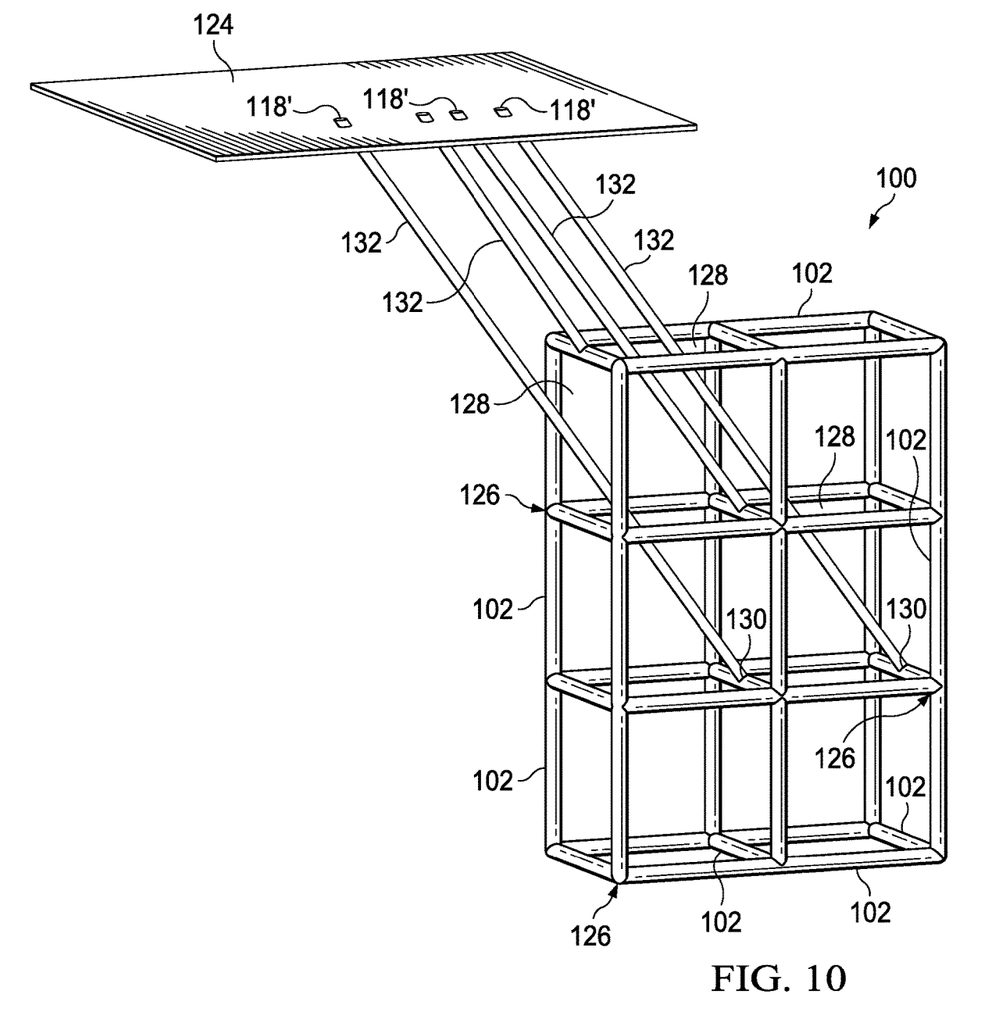
FIGS. 10, 11 and 12 are views from various angles of a 3D schematic representation of a graphene or graphene/polymer micro-lattice with connectors to gates on various horizontal lattice members.
Figure 11:
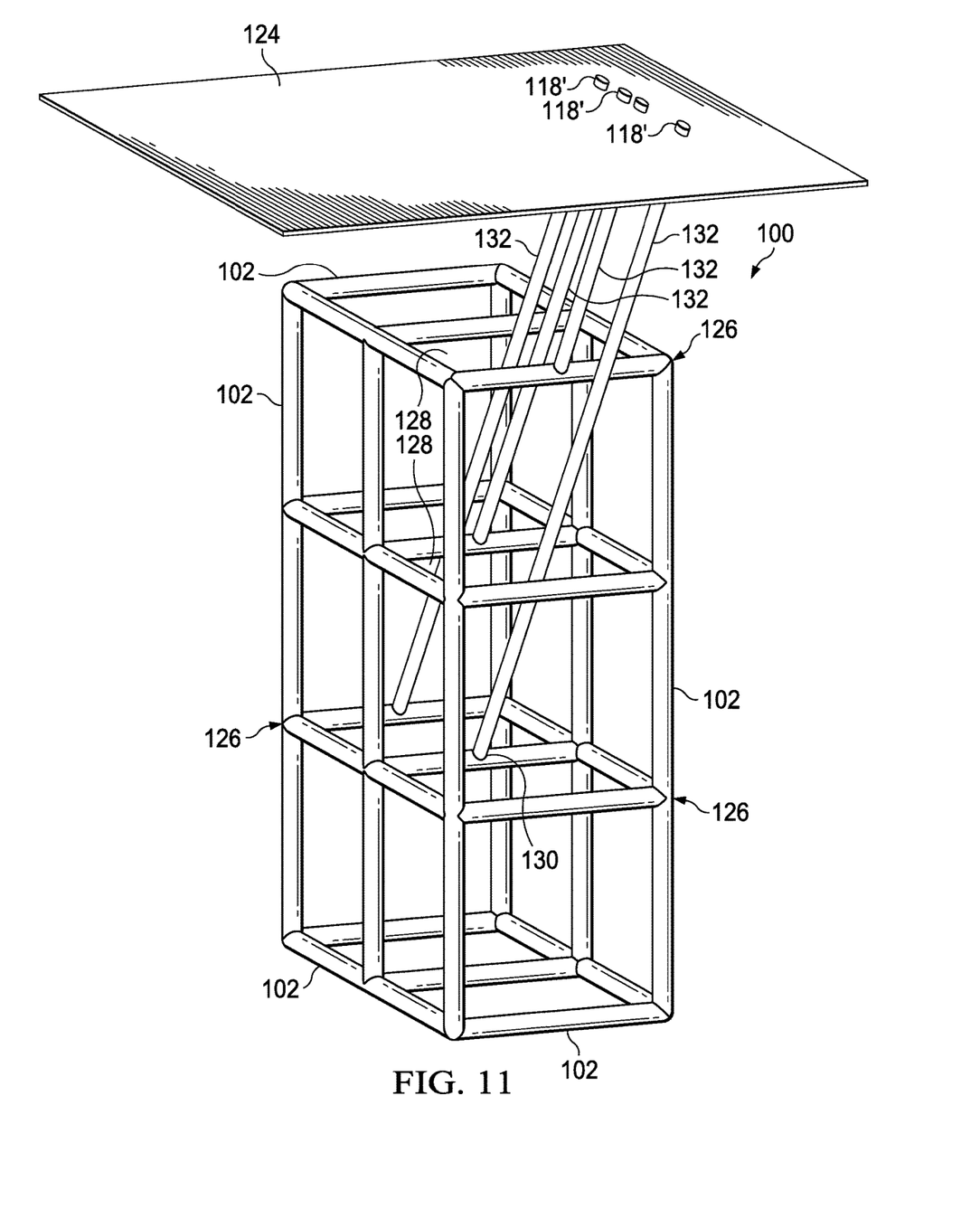
Figure 12:
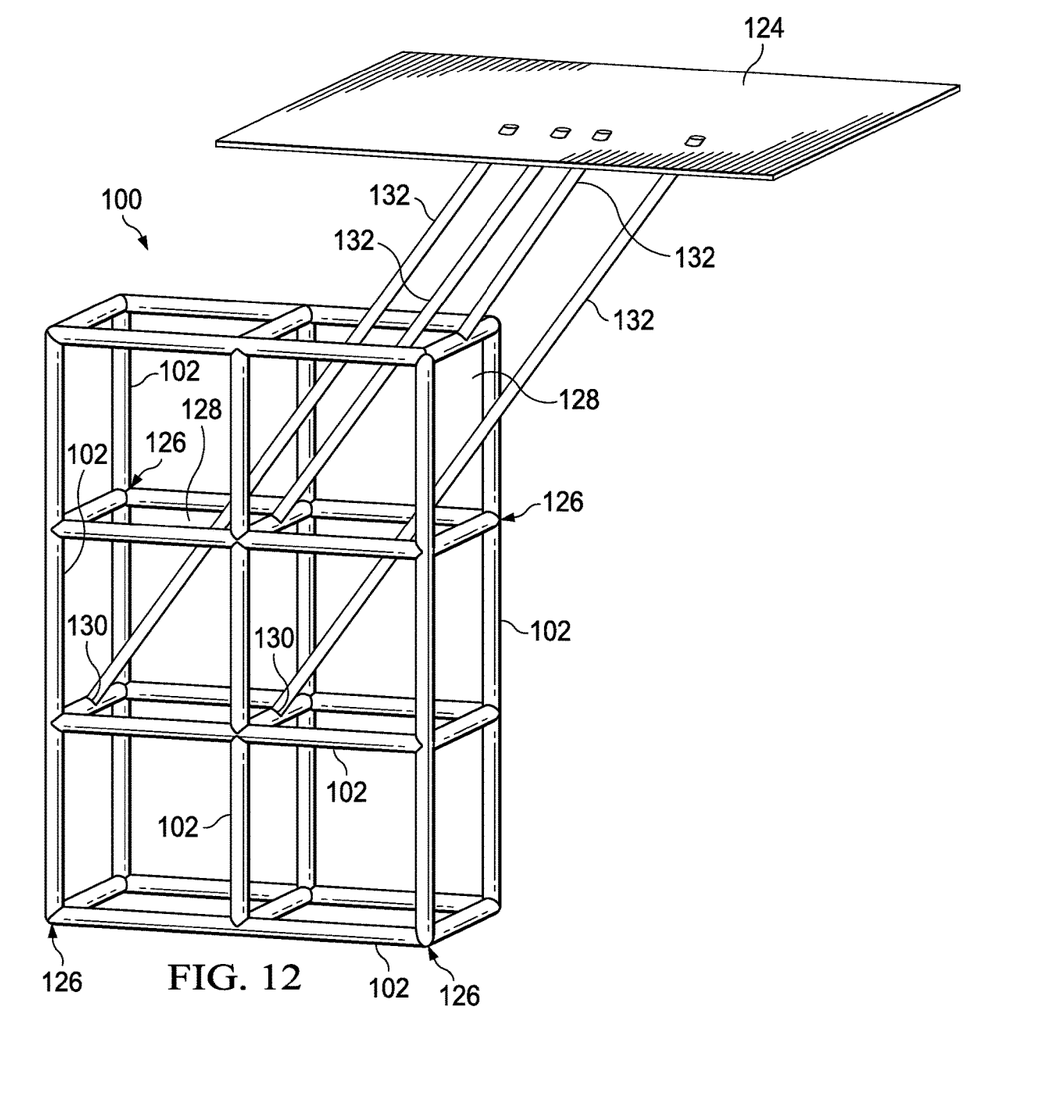
Figure 13:
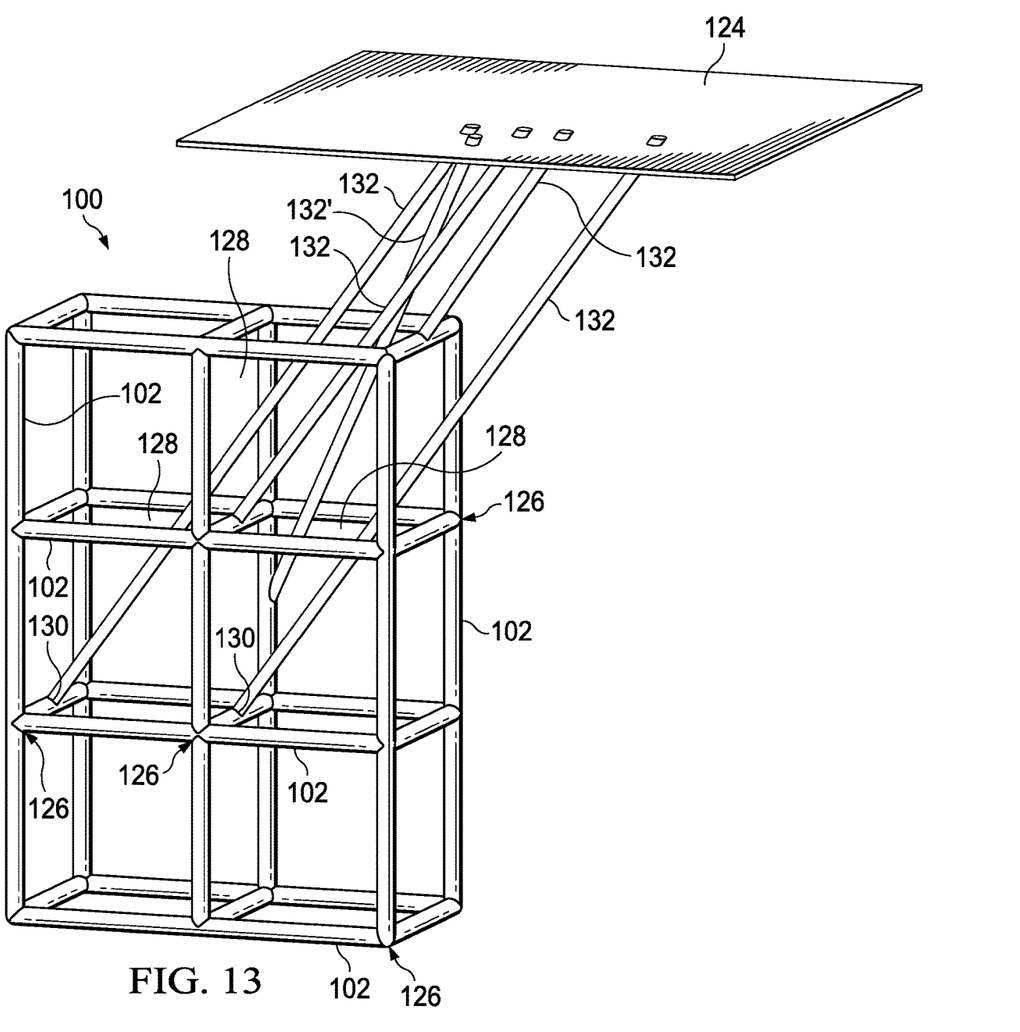
FIGS. 13, 14 and 15 are views from various angles of a 3D schematic representation of a graphene or graphene/polymer micro-lattice with connectors to gates on both horizontal and vertical lattice members.
Figure 14:
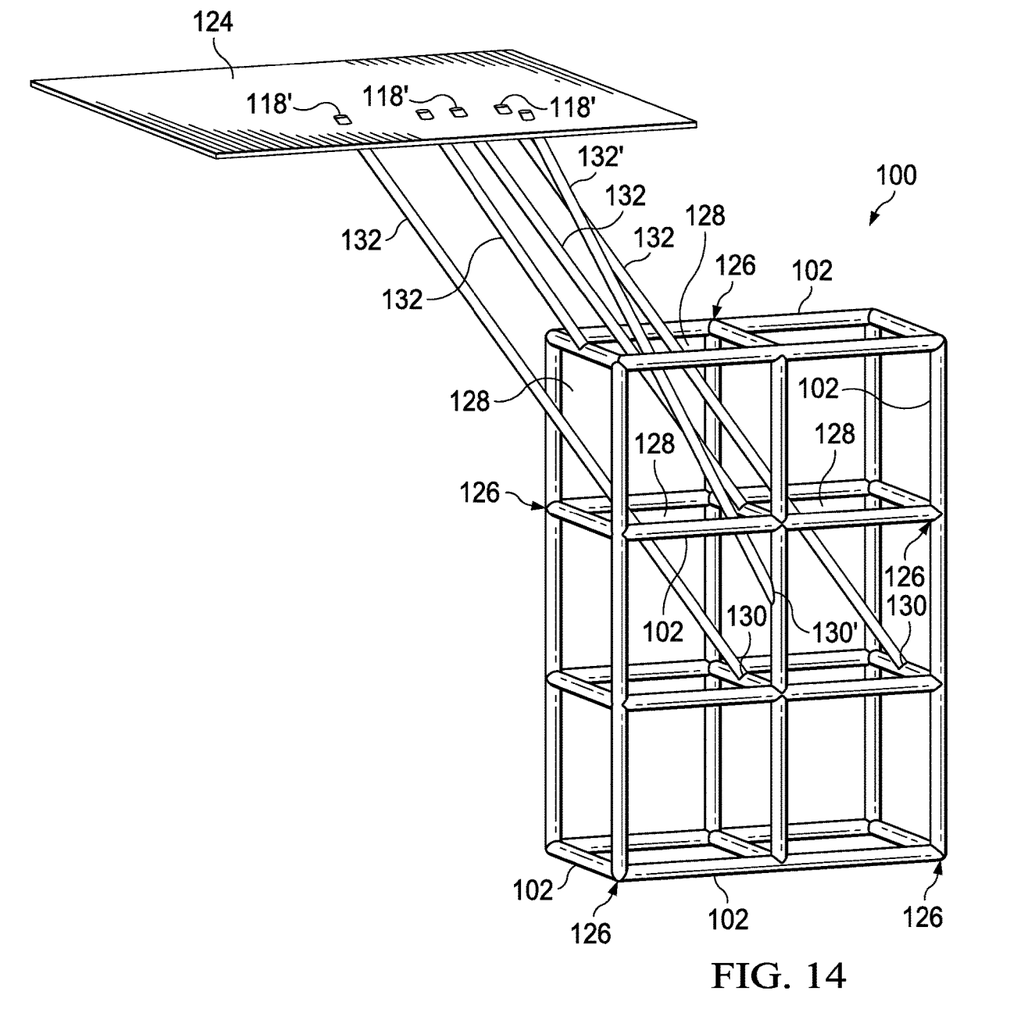
Figure 15:
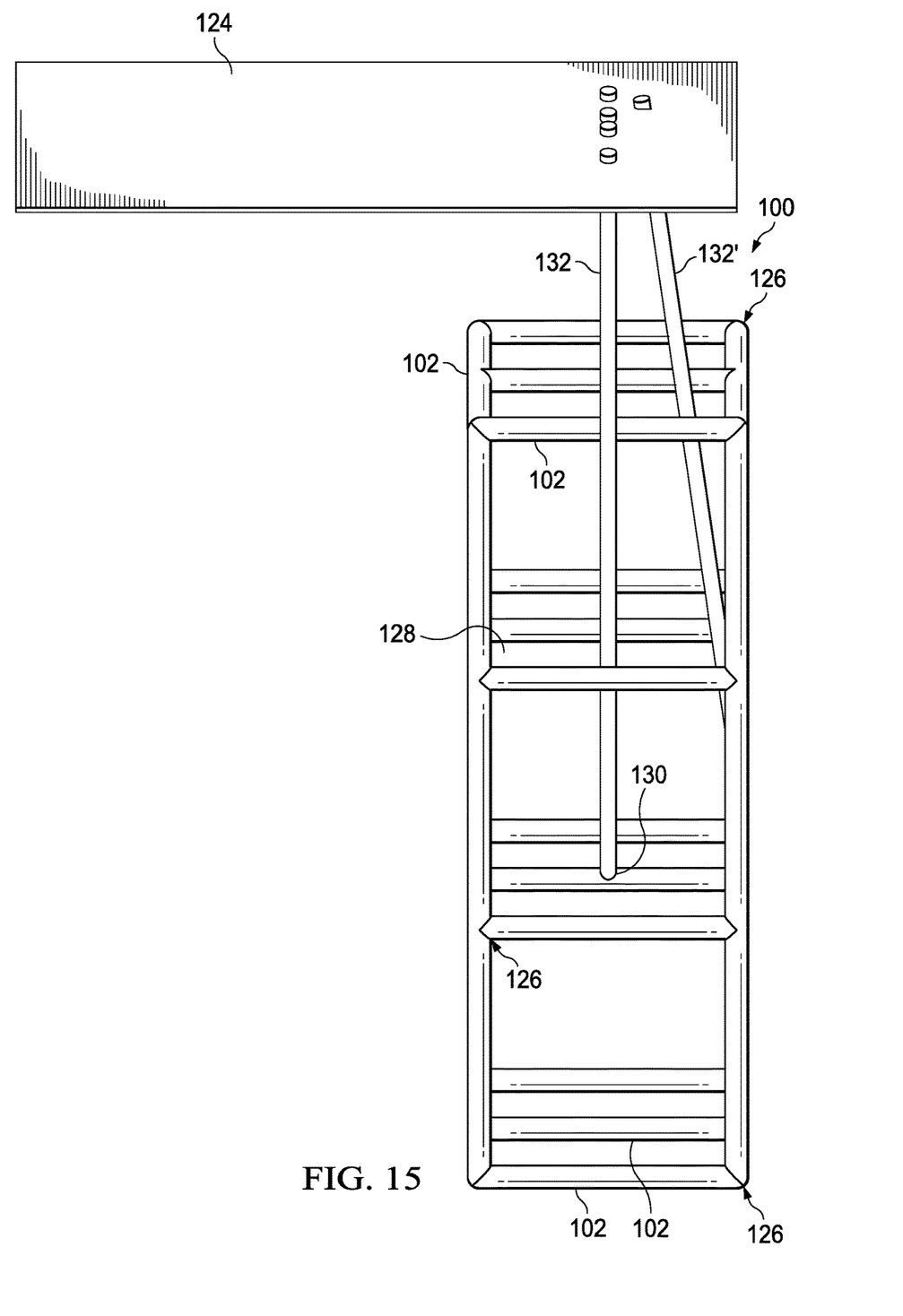

In FIGS. 10, 11 and 12, the gates 130 are all located in horizontal members of the lattice. In this situation, gate connectors 132 may be co-planar. FIGS. 13, 14 and 15 illustrate how a gate 130' in a vertical member of the lattice may be reached with a "skewed" gate connector 132' without interfering with other gate connectors 132 and lattice members.

Modifications are possible in the described embodiments, and other embodiments are possible, within the scope of the claims.

What is claimed is:

1. A switchable array comprising:
   a microstructure of interconnected units formed of graphene tubes with open spaces in the microstructure bounded by the graphene tubes;
   at least one field-effect transistor (FET) gate in at least one of the graphene tubes; and
   a control line having an end connected to the at least one FET gate, the control line extending to a periphery of the microstructure.

2. The switchable array of claim 1, wherein the graphene tubes are arranged in an ordered structure and form symmetric patterns that repeat along principal directions of three-dimensional space.

3. The switchable array of claim 1, wherein the graphene tubes form a rigid structure.

4. The switchable array of claim 1, wherein the microstructure forms a micro-lattice.

5. The switchable array of claim 1, wherein the graphene tubes are hollow.

6. The switchable array of claim 1, wherein the graphene tubes are interconnected by chemical electronic bonds.

7. The switchable array of claim 1, wherein the control line passes through at least one open space bounded by the microstructure.

8. The switchable array of claim 7, wherein the control line passes through open spaces bounded by the microstructure.

9. The switchable array of claim 1, wherein the control line comprises a polymer plated with an electrically conductive metal.

* * * * *